(12) United States Patent
Nam et al.

(10) Patent No.: US 7,264,987 B2
(45) Date of Patent: Sep. 4, 2007

(54) METHOD OF FABRICATING OPTOELECTRONIC INTEGRATED CIRCUIT CHIP

(75) Inventors: Eun Soo Nam, Daejeon (KR); Ho Young Kim, Daejeon (KR); Myoung Sook Oh, Daejeon (KR); Dong Yun Jung, Daejeon (KR); Seon Eui Hong, Daejeon (KR); Kyoung Ik Cho, Daejeon (KR)

(73) Assignee: Electronics and Telecommunications Research Institute, Daejeon-Shi (KR)

( * ) Notice: Subject to any disclaimer, the term of this patent is extended or adjusted under 35 U.S.C. 154(b) by 291 days.

(21) Appl. No.: 11/012,699

(22) Filed: Dec. 16, 2004

(65) Prior Publication Data

US 2005/0170549 A1    Aug. 4, 2005

(30) Foreign Application Priority Data

Dec. 22, 2003  (KR) ............... 10-2003-0094753
Jul. 22, 2004  (KR) ............... 10-2004-0057043

(51) Int. Cl.
*H01L 21/00* (2006.01)

(52) U.S. Cl. ................. 438/59; 257/E21.387
(58) Field of Classification Search ........... 438/59; 257/E21.387
See application file for complete search history.

(56) References Cited

U.S. PATENT DOCUMENTS

2003/0222265 A1* 12/2003 Nam et al. ............. 257/85

FOREIGN PATENT DOCUMENTS

KR    100243659    11/1999

OTHER PUBLICATIONS

K. Takahata, et al.; "10-Gb/s Two-Channel Monolithic Photoreceiver Array Using Waveguide p-i-n PD's and HEMT's"; IEEE Photonics Technology Letters, vol. 8, No. 4; Apr. 1996.
S. Chandrasekhar, et al.; "A 10 Gbit/s OIEC Photoreceiver Using InP/InGaAs Heterjunction Bipolar Transistors"; Electronics Letters, vol. 28, No. 5; Feb. 1992.

* cited by examiner

*Primary Examiner*—Bradley K Smith
(74) *Attorney, Agent, or Firm*—Lowe Hauptman & Berner LLP

(57) ABSTRACT

Provided is a method of fabricating an optoelectronic integrated circuit chip. In particular, a method of fabricating an optoelectronic integrated circuit chip is provided, in which an optical absorption layer of a wave-guide type optical detector is grown to be thicker than a collector layer of a hetero-junction bipolar transistor by using a selective area growth by metal organic chemical vapor deposition (MOCVD) method, and the wave-guide type optical detector and the hetero-junction bipolar transistor are integrated as a single chip on a semi-insulated InP substrate, thereby readily realizing the wave-guide type optical detector improved in quantum efficiency and having the ultra-high speed characteristics.

8 Claims, 5 Drawing Sheets

METHOD OF FABRICATING OPTOELECTRONIC INTEGRATED CIRCUIT CHIP

CROSS-REFERENCE TO RELATED APPLICATION

This application claims the benefit of Korea Patent Application Nos. 2003-94753 filed on Dec. 22, 2003 and 2004-57043 filed on Jul. 22, 2004, the disclosure of which is hereby incorporated herein by reference in its entirety.

BACKGROUND OF THE INVENTION

1. Field of the Invention

The present invention relates to a method of fabricating an optoelectronic integrated circuit chip, and more particularly, to a method of fabricating an optoelectronic integrated circuit chip, in which an optical absorption layer of a wave-guide type optical detector is formed to be thicker than a collector layer of a hetero-junction bipolar transistor by using a selective area growth by MOCVD (Metal Organic Chemical Deposition), and the wave-guide type optical detector and the hetero-junction bipolar transistor are integrated as a single chip on a semi-insulated InP substrate, thereby readily realizing the wave-guide type optical detector with an improved external quantum efficiency and having the ultra-high speed characteristics.

2. Description of the Related Art

In a conventional optical receiver chip mainly used in an optical communication system, as shown in FIG. 1, a long wavelength optical detector A having a typical PiN structure of p+InGaAs/n–InGaAs/n+InGaAs, and a hetero-junction bipolar transistor B having a structure of n+InP/p+InGaAs/n–InGaAs/n+InGaAs which is as same as that of PiN in part are integrated as a single chip on a semi-insulated InP substrate 10.

That is, the long wavelength optical detector A includes an n+InGaAs layer 21a, an n–InGaAs optical absorption layer 22a, a p+InGaAs ohmic layer 23a, a p-electrode 29 formed on the p+InGaAs ohmic layer 23a, and an n-electrode 30 formed on a predetermined region of the n+InGaAs layer 21a, which are sequentially stacked on the semi-insulated InP substrate 10.

Further, the hetero junction bipolar transistor B includes an n+InGaAs sub-collector 21b, an n–InGaAs collector layer 22b, a p+InGaAs base 23b, an n+InP emitter 24, and an n+InGaAs ohmic layer 25, which are sequentially stacked. Here, the n–InGaAs collector layer 22b and the p+InGaAs base 23b are formed on a predetermined region of the n+InGaAs sub-collector 21b. Further, the n+InP emitter 24 and the n+InGaAs ohmic layer 25 are formed on a predetermined region of the p+InGaAs base 23b. Also, an emitter electrode 26 is formed on the n+InGaAs ohmic layer 25, a base electrode 27 is formed on a predetermined region of the p+InGaAs base 23b, and a collector electrode 28 is formed on a predetermined region of the n+InGaAs sub-collector 21b.

Meanwhile, a polymer layer 40 for protection and electrical insulation is formed on surfaces of the long wavelength optical detector A and the hetero-junction bipolar transistor B as described above. The polymer layer 40 is formed with a via hole to expose each electrode therethrough, so that the p-electrode 29 of the optical detector A and the base electrode 27 of the hetero-junction bipolar transistor B are connected to each other through an air bridge metal line.

As described above, the long wavelength optical detector having the foregoing simple PiN structure of p+InGaAs/n–InGaAs/n+InGaAs is not in need of an additional separate crystal growth process because crystal layers of the base, collector and the sub-collector of the hetero-junction bipolar transistor are formed as the same layer structure as PIN photodiode, so that this structure has been widely used.

In a current high-capacity ultra-high speed optical communication system, the optical detector is used to convert a ultra short optical signal pulse into an electrical signal, and then to amplify the converted electronic signal. Thus, the optical communication system should include a front end receiver having a complicated optoelectronic circuit for detecting and amplifying the ultra high speed optical signal, so that the manufacturing cost is increased. Consequently, it is difficult to economically fabricate an optical receiver with an excellent sensitivity.

In order to develop an economical ultra-high speed and long-distance high-capacity optical communication system, the optical receiver should be economically fabricated by a simple fabrication process. Further, in order to simplify the fabrication process of the optical receiver, it is preferable that a wave-guide type optical detector having both high quantum efficiency and ultra-high speed characteristics due to a thick optical absorption layer of waveguide structure formed by using a selective area growth by MOCVD, and a hetero-junction bipolar transistor capable of applying high gain characteristics to the converted electrical signal are integrated as a single chip on a semi-insulated InP substrate.

In addition, in the conventional structure, the optical absorption layer is configured to absorb surface incident light.

SUMMARY OF THE INVENTION

The present invention is directed to a method of fabricating an optoelectronic integrated circuit chip, in which an optical absorption layer of a wave-guide type optical detector is formed by using a selective area growth by MOCVD to be thicker than a collector layer of a hetero-junction bipolar transistor, thereby enhancing quantum efficiency and increasing alignment tolerance with an optic fiber.

The present invention is also directed to a method of fabricating an optoelectronic integrated circuit chip, in which a ultra-high speed wave-guide type optical detector including a thick optical absorption layer formed by using a selective area growth by MOCVD and having high quantum efficiency, and a hetero-junction bipolar transistor are integrated as a single chip on a semi-insulated InP substrate, so that light is converted into an electrical signal by the wave-guide type optical detector, and the converted electrical signal is amplified by the high gain hetero-junction bipolar transistor having a crystal layer structure of n+InP/p+InGaAs/n–InGaAs/n+InGaAs integrated together with the wave-guide type optical detector as a single chip on the semi-insulated InP substrate, thereby enhancing receiver sensitivity and detection speed.

One aspect of the present invention is to provide a method of fabricating an optoelectronic integrated circuit chip, comprising the steps of: (a) forming a sub-collector layer and a first semiconductor layer on an optical detector region and a transistor region in a substrate; (b) forming insulating mask layer patterns on the first semiconductor layer of the optical detector region and the transistor region, the insulating layer patterns having different masking layer width and gap width from each other; (c) forming an optical absorption layer as a is second semiconductor layer between the insulating mask layer patterns on the optical detector region, and forming a collector layer thinner than the optical absorption layer as the second semiconductor layer between the insulating mask layer patterns with wider gap width on the transistor region; (d) removing the insulating patterns; and (e) forming an optical detector having the sub-collector layer, the optical absorption layer and a base layer in the optical detector region, and forming a transistor having the sub-collector layer, the collector layer, the base layer and an emitter layer in the transistor region.

According to an aspect of the invention, the second semiconductor layer may be formed of an n–InGaAs layer and may be grown by a metal organic chemical vapor deposition (MOCVD) method.

BRIEF DESCRIPTION OF THE DRAWINGS

The above and other features of the present invention will be described in reference to certain exemplary embodiments thereof with reference to the attached drawings in which.

DETAILED DESCRIPTION OF THE INVENTION

The present invention will now be described more fully hereinafter with reference to the accompanying drawings, in which preferred embodiments of the invention are provided so that this disclosure will be thorough and complete, and will fully convey the scope of the invention to those skilled in the art.

Figure 1:
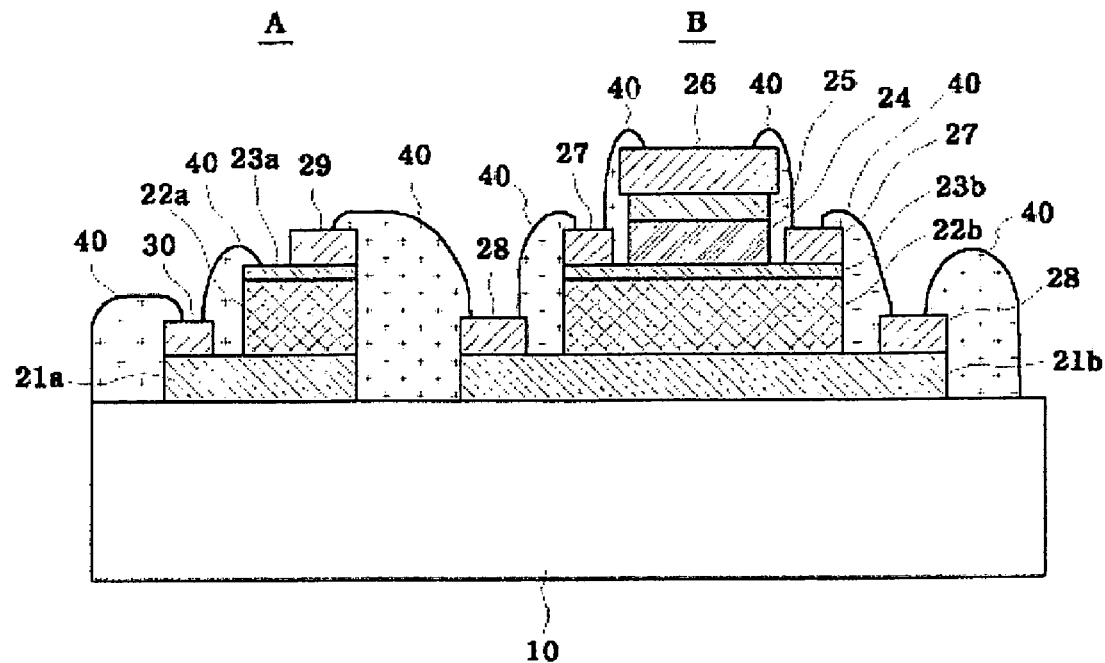
FIG. 1 is a cross-sectional view of an optical receiver chip, in which a surface incidence type long wavelength optical detector having a conventional PiN structure and a hetero-junction bipolar transistor of n+InP/p+InGaAs/n–InGaAs/n+InGaAs are integrated.
Figure 2:
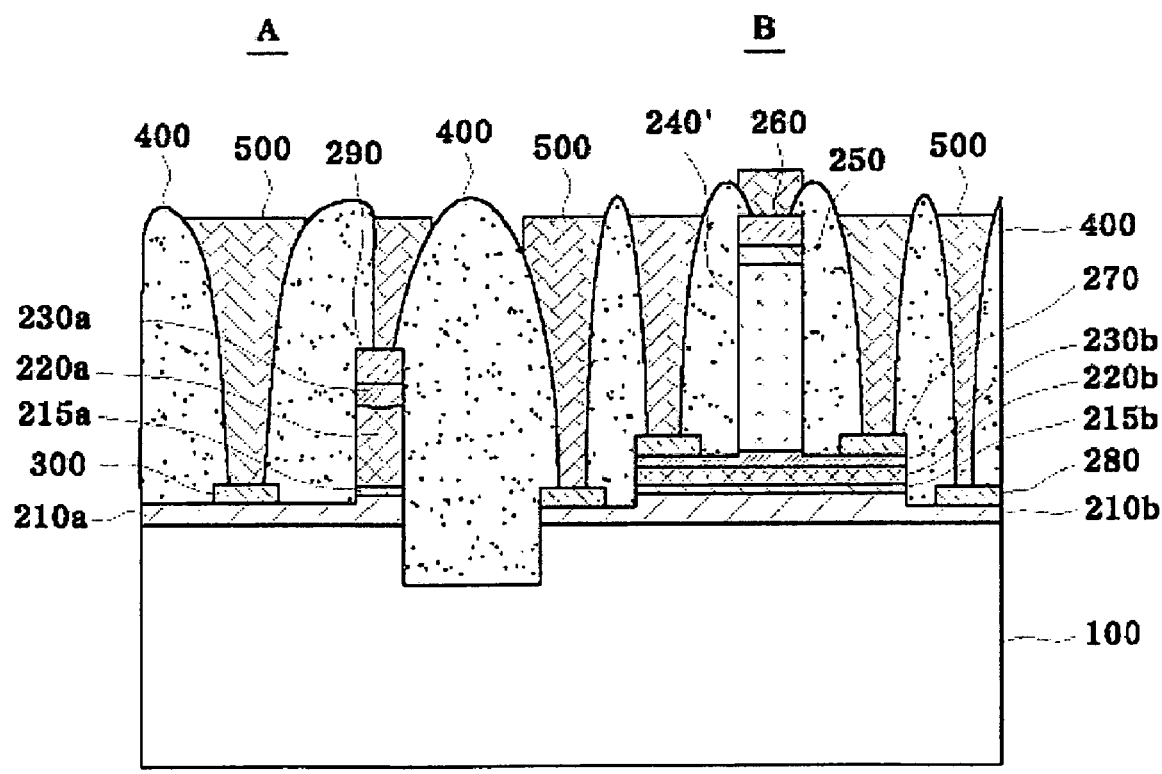
FIG. 2 is a cross-sectional view of an optoelectronic integrated circuit chip according to an embodiment of the present invention.

FIG. 2 is a cross-sectional view of an optoelectronic integrated circuit chip according to an embodiment of the present invention.

Referring to FIG. 2, a wave-guide type optical detector A and a hetero-junction bipolar transistor B are integrated as a single chip on a semi-insulated InP substrate 100.

The wave-guide type optical detector A includes an n+InGaAs layer 210a, an n–InP layer 215a, an n–InGaAs optical absorption layer 220a, and a p+InGaAs ohmic layer 230a, which are sequentially stacked on a predetermined region of the semi-insulated InP substrate 100. Here, the n–InGaAs optical absorption layer 220a and the p+InGaAs ohmic layer 230a are formed on a predetermined region of the n–InP layer 215a used as a selective sacrificial etching layer. Further, a p-electrode 290 is formed on a predetermined region of the p+InGaAs ohmic layer 230a, and an n-electrode 300 is formed on a predetermined region of the n+InGaAs layer 210a.

The hetero-junction bipolar transistor B includes an n+InGaAs sub-collector 210b, an n–InP layer 215b, an n–InGaAs collector layer 220b, a p+InGaAs base 230b, an n+InP emitter 240', and an n+InGaAs ohmic layer 250, which are sequentially stacked. Here, the n–InGaAs collector layer 220b and the p+InGaAs base 230b are formed on the n–InP layer 215b used as a selective sacrificial etching layer. Further, the n+InP emitter 240' and the n+InGaAs ohmic layer 250 are formed on a predetermined region of the p+InGaAs base 230b.

Further, an emitter electrode 260 is formed on the n+InGaAs ohmic layer 150, a base electrode 270 is formed on the p+InGaAs base 230b, and a collector electrode 280 is formed on the n+InGaAs sub-collector 210b.

Meanwhile, a polymer layer 400 for surface protection and electrical insulation is formed on the entire surfaces of the wave-guide type optical detector A and the hetero-junction bipolar transistor B. The polymer layer 400 is formed with a via hole to expose each electrode therethrough, so that the p-electrode 290 of the optical detector A and the base electrode 270 of the hetero-junction bipolar transistor B are connected to each other through an air bridge metal line formed of a gold plating layer 500 filled in the hole.

At this time, the n–InGaAs optical absorption layer 220a of the wave-guide type detector A is thicker than the n–InGaAs collector layer 220b of the hetero-junction bipolar transistor B, so that the quantity of light absorbed in a section of the wave-guide type optical detector is increased to thereby enhance quantum efficiency.

FIGS. 3A through 3J are cross-sectional views illustrating a fabrication method of an optoelectronic integrated circuit chip according to an embodiment of the present invention.

Figure 3A:
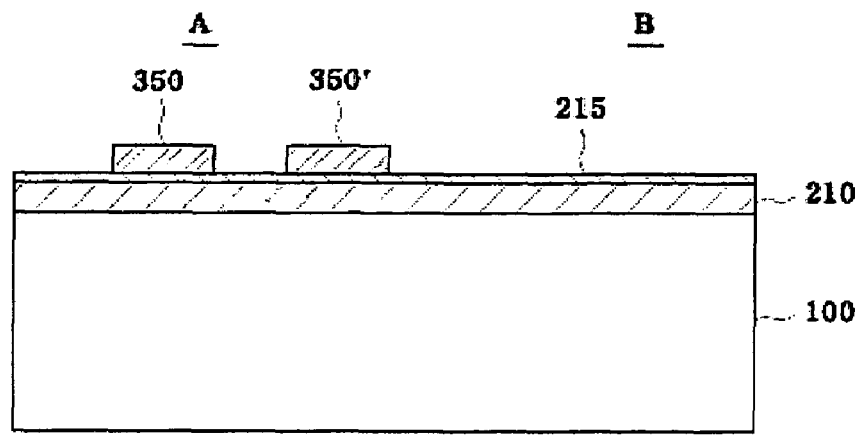
FIGS. 3A through 3J are cross-sectional views illustrating a fabrication method of an optoelectronic integrated circuit chip according to an embodiment of the present invention.

Referring to FIG. 3A, an n+InGaAs sub-collector layer 210 and an n–InP layer 215 used as a selective sacrificial etching layer are sequentially formed on a semi-insulated InP substrate 100. Then, insulating mask layer patterns 350 and 350' are formed on the n–InP layer 215, which are spaced apart from each other by a predetermined distance. At this time, the insulating mask layer patterns 350 and 350' in the wave-guide type optical detector A are formed by deposition of an insulating material, for example, silicon nitride ($Si_3N_x$).

Figure 3B:
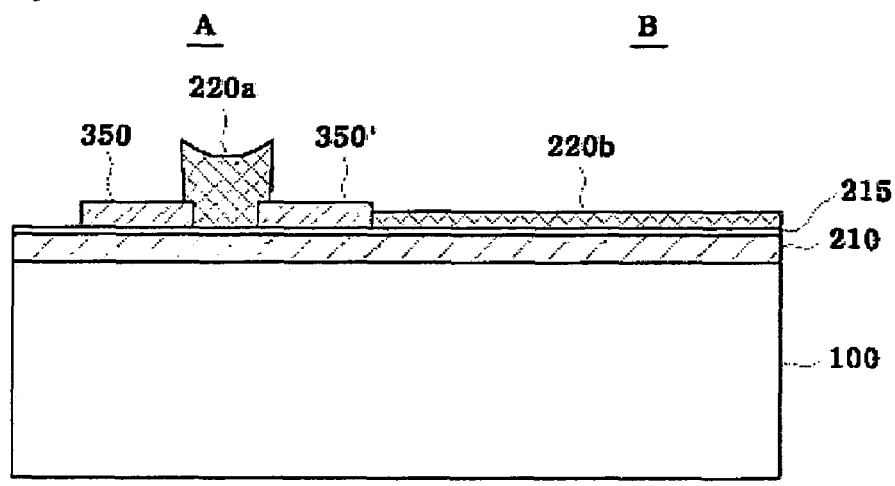

Referring to FIG. 3B, an n–InGaAs layer is grown on the n–InP layer 215 between the insulating mask layer patterns 350 and 350' and on all remaining part of the wafer without the insulating mask layer patterns 350', using a selective area growth method, e.g. an MOCVD method. Therefore, the n–InGaAs optical absorption layer 220a is formed in the region of the wave-guide type optical detector A, and the relatively thinner n–InGaAs collector layer 220b than the n–InGaAs optical absorption layer 220a is formed in the region of the hetero-junction bipolar transistor B. That is, a gap width between the insulating mask layer patterns 350 and 350' in the region of the wave-guide type optical detector A is narrower than the region of the hetero-junction bipolar transistor B, so that the n–InGaAs optical absorption layer 220a grown between the insulating mask layer patterns 350 and 350' in the region of the wave-guide type optical detector A has a thickness larger than that of the n–InGaAs collector layer 220b formed in the region of the hetero-junction bipolar transistor B.

Thus, the wave-guide type optical detector A can be fabricated to have the optimized quantum efficiency according to the gap distance between the insulating layer patterns 350 and 350', and the layer width of the insulating mask layer patterns 350 and 350'. At this time, the wider the insulating mask layer patterns 350 and 350' are, the more the number of elements transferred from the insulating mask layer patterns 350 and 350' to a growth surface increases. Hence, the n–InGaAs optical absorption layer 220a becomes thicker, so that the quantum efficiency is enhanced.

For example, in the case where the gap width between the insulating mask layer patterns 350 and 350' is about 20 μm and the width of each insulating mask layer patterns 350 and 350' is 100 μm, the n–InGaAs optical absorption layer 220a grown between the insulating layer patterns 350 and 350' has a thickness of about 10,000Å, which is approximately twice a thickness (e.g. about 5,000Å) of the n–InGaAs collector layer 220b formed on the other regions. Thus, the optoelectronic integrated circuit chip satisfying both improved optical absorption efficiency and higher amplification characteristic can be fabricated by performing the selective area growth by MOCVD method once.

Figure 3C:
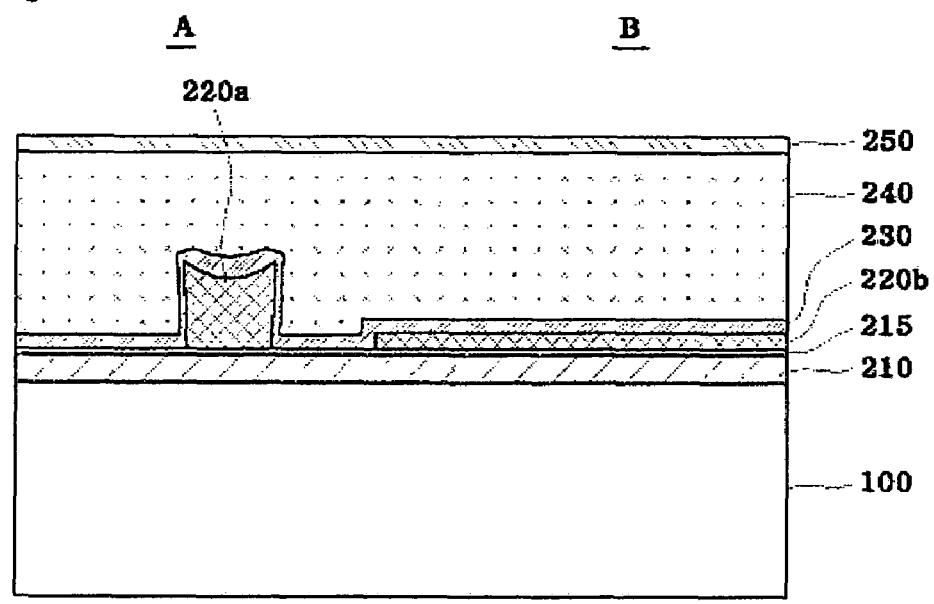

Referring to FIG. 3C, after the insulating mask layer patterns 350 and 350' are removed, a p+InGaAs base layer 230, an n+InP emitter layer 240, and an n+InGaAs ohmic layer 250 for enhancing an ohmic characteristic are sequentially grown on the resultant structure, thereby completing a crystal structure of the optoelectronic integrated circuit chip of which the n–InGaAs optical absorption layer 220a of the wave-guide type optical detector A is grown to have a larger thickness than that of the n–InGaAs collector layer 220b of the hetero-junction bipolar transistor B on the same wafer, i.e., the semi-insulated InP substrate 100.

According to an embodiment of the present invention, the n+InGaAs ohmic layer 250 is grown on the n+InP emitter layer 240, but not limited to. Alternatively, the n+InGaAs ohmic layer 250 on the n+InP emitter layer 240 may be omitted.

As described above, when the crystal structure for fabricating the optoelectronic integrated circuit chip having the excellent quantum efficiency is completely grown, the hetero-junction bipolar transistor B is fabricated using an insulating mask layer and a general photolithography process.

Figure 3D:
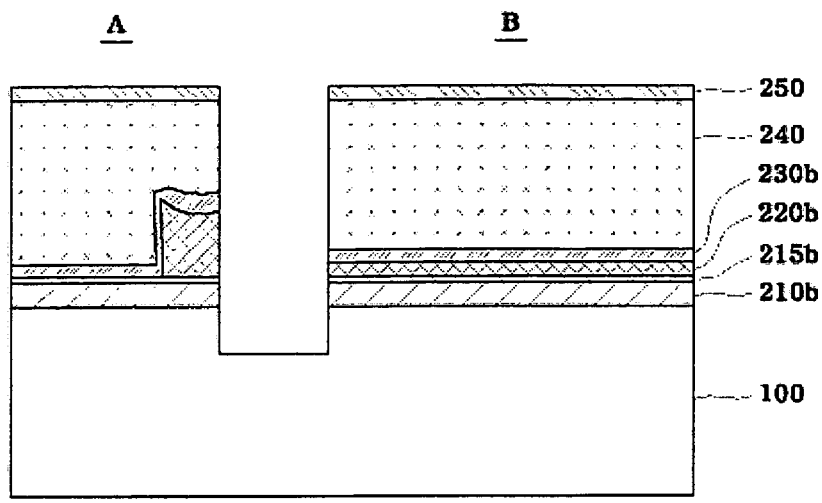

Referring to FIG. 3D, first, the regions of the optical detector A and the hetero-junction bipolar transistor B are defined. Further, an insulating mask layer is formed and etched by a photolithography process to isolate the optical detector A and the hetero-junction bipolar transistor B from each other, and then the n+InGaAs ohmic layer 250, the n+InP emitter layer 240, the p+InGaAs base layer 230, the n–InP layer 215 and the n+InGaAs sub-collector layer 210 are sequentially removed by applying a reactive ion etching method from the n+InGaAs ohmic layer 250 to a predetermined depth of the semi-insulated InP substrate 100, to thereby expose the semi-insulated InP substrate 100.

Figure 3E:
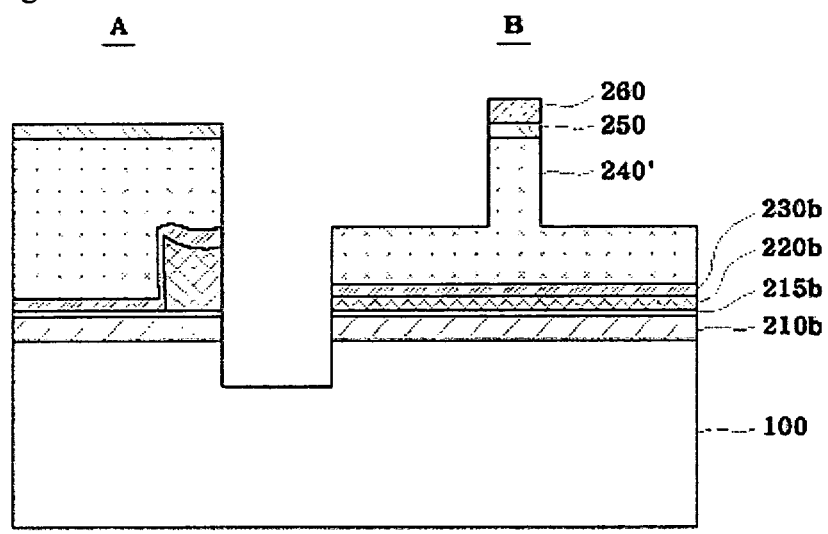

Referring to FIG. 3E, an insulating mask layer is deposited as an etching mask to cover the region of the wave-guide type optical detector A and expose the region of the hetero-junction bipolar transistor B, and then the n+InGaAs ohmic layer 250 and the n+InP emitter layer 240 are selectively etched to form an n+InP emitter 240' having an mesa structure. Further, an emitter electrode 260 is formed on the n+InGaAs ohmic layer 250.

In this embodiment, the emitter electrode 260 is formed on the n+InGaAs ohmic layer 250, but not limited to. Alternatively, the emitter electrode 260 may be directly formed on the n+InP emitter layer 240 without forming the n+InGaAs ohmic layer 250.

Figure 3F:
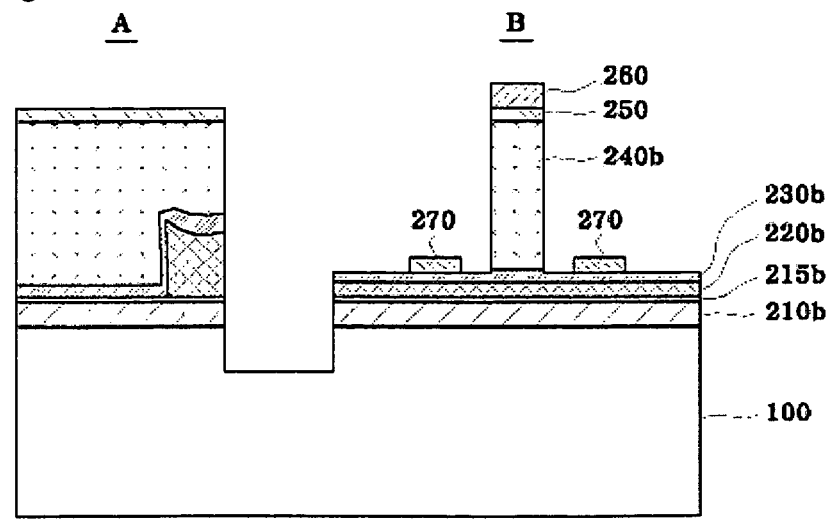

Referring to FIG. 3F, the surface of a p+InGaAs base 230b is exposed by the photolithography process, and then a base electrode 270 having a Ti/Pt/Au structure is formed by evaporation and lift-off processes.

Figure 3G:
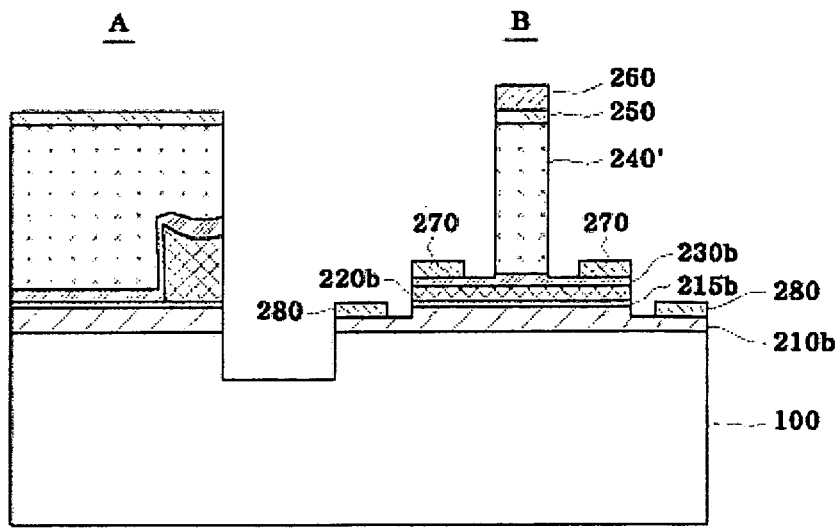

Referring to FIG. 3G, a p+InGaAs base 230b, an n–InGaAs collector layer 220b and an n–InP layer 215b disposed outside the base electrode 270 are removed by the photolithography and etching processes to expose the top surface of an n+InGaAs sub-collector 210b. Then, a collector electrode 280 having a Ti/Pt/Au structure is formed on the exposed top surface of the n+InGaAs sub-collector 210b by the evaporation and lift-off processes, thereby completing the hetero-junction bipolar transistor B.

Here, the emitter electrode 260, the base electrode 270 and the collector electrode 280 can be formed at once by one process.

Figure 3H:
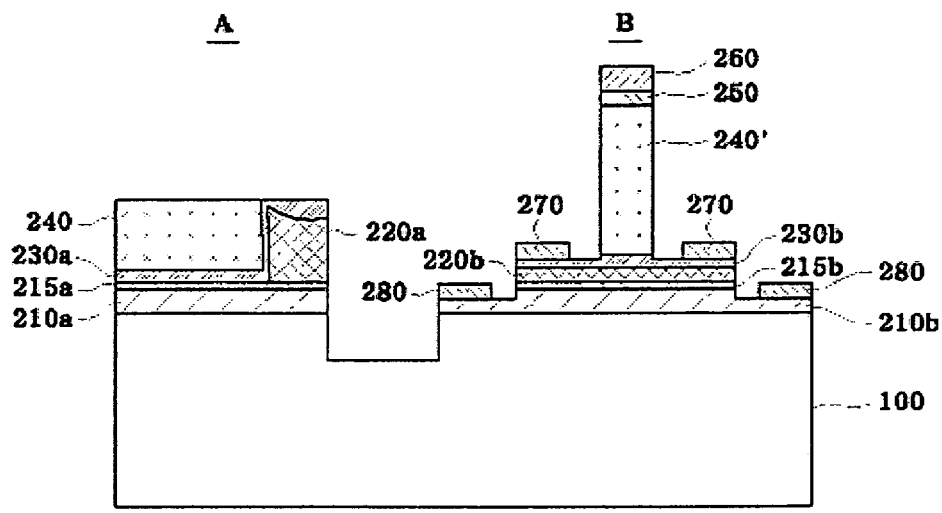

Referring to FIG. 3H, in order to fabricate the wave-guide type optical detector A, an insulating mask layer is formed as an etching mask to cover the region of the fabricated hetero-junction bipolar transistor B and expose the region of the waveguide type optical detector A, and then the n+InGaAs ohmic layer 250 and a portion of the n+InP emitter layer 240 in the region of the waveguide type optical detector A are etched and plarnarized.

Figure 3I:
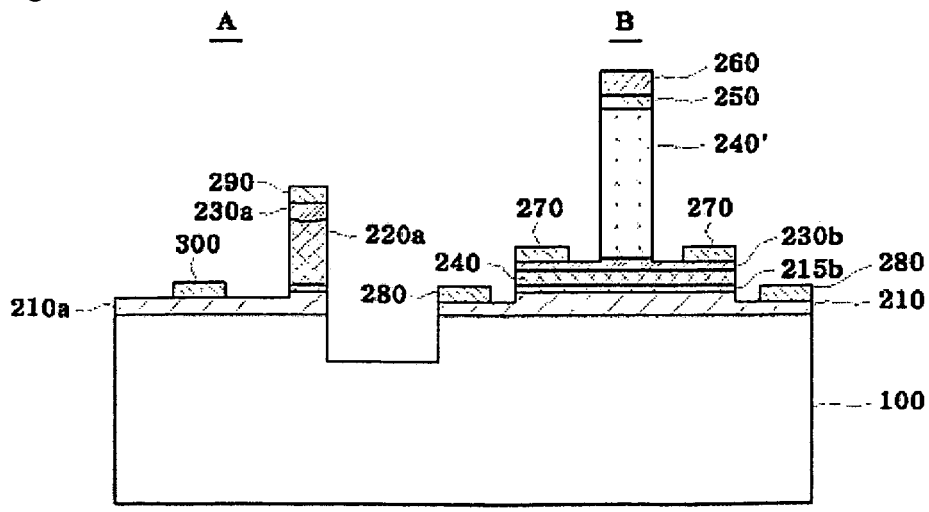

Referring to FIG. 3I, the n–InP emitter layer 240, the p+InGaAs ohmic layer 230a, the n–InGaAs optical absorption layer 220a, the n–InP layer 215a, and the n+InGaAs layer 210a are removed by the photolithography process and the etching process in a predetermined region of the waveguide type optical detector A, so that the n+InGaAs layer 210a is exposed, thereby allowing a predetermined region of the optical detector A to have a wave-guide structure.

Then, a p-electrode 290 having a Ti/Pt/Au structure is formed on a predetermined region of the p+InGaAs ohmic layer 230a by the deposition and lift-off processes. Further, after an n-electrode 300 having a Ti/Pt/Au structure is formed on the exposed region of the n+InGaAs layer 210a by the deposition and lift-off processes, an annealing process, i.e., a heat treatment process is applied is thereto, thereby completing the wave-guide type optical detector A. In this embodiment, the p-electrode 290 is formed on a top surface of the p+InGaAs ohmic layer 230a, but not limited to. Alternatively, the p-electrode 290 may be directly formed on the n–InGaAs optical absorption layer 220a without forming the p+InGaAs ohmic layer 230a.

Figure 3J:
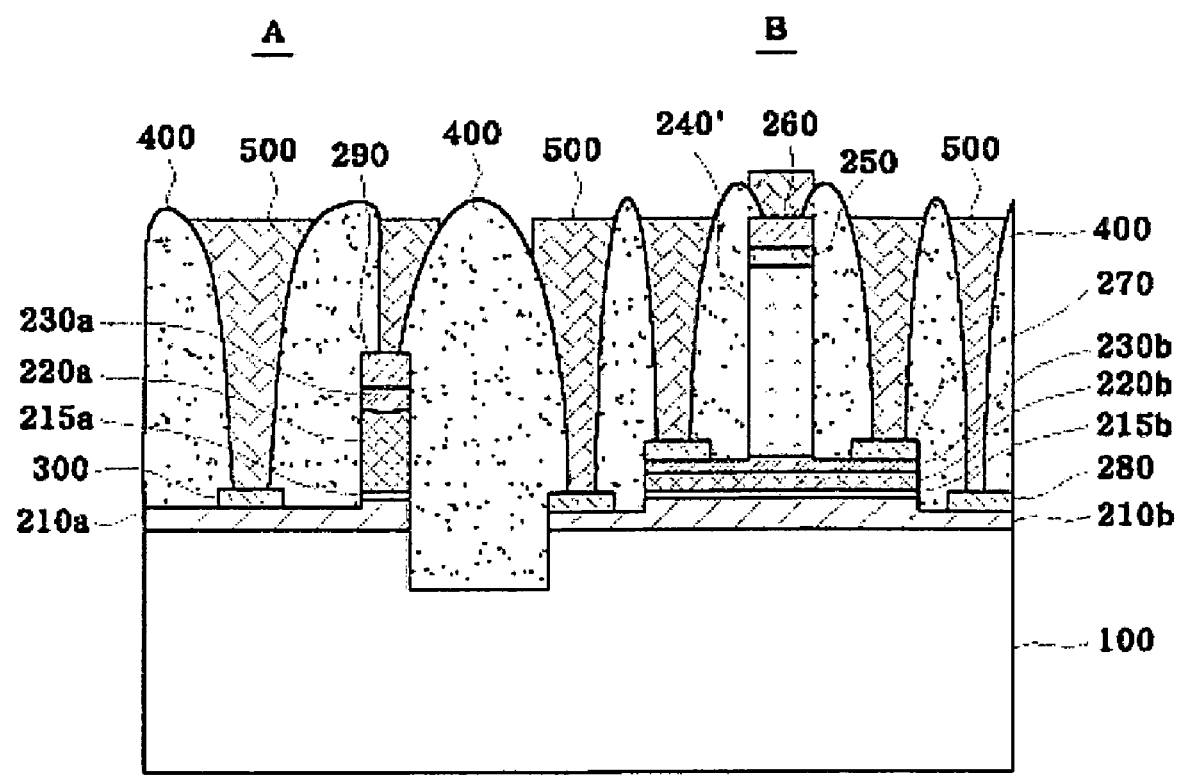

Referring to FIG. 3J, a polymer layer 400 for surface protection and electrical insulation is formed on the entire surface of the wave-guide type optical detector A and the hetero-junction bipolar transistor B, and then a via hole is formed on the polymer layer 400 to expose each electrode. Then, a gold plating layer 500 is filled in the via hole, thereby forming an air bridge metal line connecting the p-electrode 290 of the optical detector A and the base electrode 270 of the hetero-junction bipolar transistor B to each other. Finally, the optoelectronic integrated circuit chip, on which the wave-guide type optical detector A and the hetero-junction bipolar transistor B of the n+InP/p+InGaAs/n–InGaAs/n–InP/n+InGaAs structure are integrated, is completed.

As described above, the n–InGaAs optical absorption layer 220a is grown to be thicker than the n–InGaAs collector layer 220b by the selective area growth by MOCVD method using the insulating mask layer patterns 350 and 350', so that the quantity of light absorbed in the edge section of the n–InGaAs optical absorption layer 220a is increased, thereby enhancing quantum efficiency.

That is, the characteristic of the hetero-junction bipolar transistor B is optimized, and the wave-guide type optical detector A is improved in the quantum efficiency due to the relatively thick n–InGaAs optical absorption layer 220a.

Therefore, when the n–InGaAs optical absorption layer 220a of the wave-guide type optical detector A is designed, the layer width and gap width of the insulating mask layer patterns 350 and 350' is optimized, thereby fabricating the wave-guide type optical detector A optimized in the quantum efficiency.

In the method of fabricating an optoelectronic integrated chip according to an embodiment of the present invention as described above, the optical absorption layer of the wave-guide type optical detector is formed to be thicker than the collector layer of the hetero-junction bipolar transistor by using the selective area growth by MOCVD method, thereby enhancing quantum efficiency and improving alignment tolerance with an optic fiber.

Further, the optical detector is fabricated to have a wave-guide type structure, so that the optic fiber is aligned at a side of the optical detector, thereby improving alignment tolerance between the optic fiber and the optical detector.

Still further, the wave-guide type optical detector and the hetero-junction bipolar transistor are integrated as a single chip, so that the optical detector and the hetero-junction bipolar transistor can be grown at the same time because they are vertically grown independent of each other, thereby simplifying the fabrication process as compared with other single chips requiring the crystal is growth process many times.

While the present invention has been described with reference to a particular embodiment, it is understood that the disclosure has been made for purpose of illustrating the invention by way of examples and is not limited to limit the scope of the invention. And one skilled in the art can make amend and change the present invention without departing from the scope and spirit of the invention.

What is claimed is:

1. A method of fabricating an optoelectronic integrated circuit chip, comprising the steps of:
   (a) forming a sub-collector layer and a first semiconductor layer on an optical detector region and a transistor region in a substrate;
   (b) forming insulating layer mask patterns on the first semiconductor layer of the optical detector region and the transistor region, the insulating mask layer patterns having layer width and gap width;
   (c) forming an optical absorption layer as a second semiconductor layer between the insulating layer patterns in the optical detector region, and forming a collector layer thinner than the optical absorption layer as the second semiconductor layer between the insulating mask layer patterns in the transistor region;
   (d) removing the insulating mask layer patterns; and
   (e) forming an optical detector having the sub-collector layer, the optical absorption layer and a base layer in the optical detector region, and forming a transistor having the sub-collector layer, the collector layer, the base layer and an emitter layer in the transistor region.

2. The method according to claim 1, wherein the step (e) comprises:
   (e1) forming the base layer and the emitter layer on an entire surface after removing the insulating layer patterns;
   (e2) isolating the optical detector region and the transistor region from each other;
   (e3) forming the transistor having a stacked structure of the sub-collector layer, the first semiconductor layer, the collector layer, the base layer and the emitter layer in the transistor region; and
   (e4) forming the optical detector having a stacked structure of the sub-collector layer, the first semiconductor layer, the optical absorption layer and the base layer in the optical detector region.

3. The method according to claim 2, wherein the step (e1) further comprises forming an ohmic layer on the emitter layer.

4. The method according to claim 2, wherein the step (e3) comprises:
   (e3-1) forming an emitter electrode on the emitter layer after forming a emitter having a mesa structure by selectively etching the emitter layer in the transistor region;
   (e3-2) forming a base electrode on a predetermined region of the base layer; and
   (e3-3) forming a collector electrode on a predetermined region of the sub-collector layer after selectively removing the base layer, the collector layer and the first semiconductor layer disposed outside the base electrode and exposing a top surface of the sub-collector.

5. The method according to claim 2, wherein the step (e4) comprises:
   (e4-1) removing the emitter layer and the base layer in the optical detector region;
   (e4-2) defining a wave-guide type optical detector by removing predetermined regions of the optical absorption layer, the first semiconductor layer and the sub-collector layer which are formed in the optical detector region to expose the sub-collector layer; and
   (e4-3) forming an n-electrode on a predetermined region of the exposed sub-collector layer after forming a p-electrode on a predetermined region of the optical absorption layer.

6. The method according to claim 2, wherein the step (e2) comprises removing the emitter layer, the base layer, the first semiconductor layer, the sub-collector layer, and a predetermined depth of the substrate at an interface between the optical detector region and the transistor region.

7. The method according to claim 1, wherein the distance between the insulating mask layer patterns of the optical detector region is narrower than that between the insulating layer patterns of the transistor region.

8. The method according to claim 1, wherein the second semiconductor layer is formed of an n-InGaAs layer and is grown by using a selective area growth by metal organic chemical vapor deposition (MOCVD) method.

* * * * *